(12) United States Patent
Murthy et al.

(10) Patent No.: US 7,678,631 B2
(45) Date of Patent: Mar. 16, 2010

(54) FORMATION OF STRAIN-INDUCING FILMS

(75) Inventors: Anand Murthy, Portland, OR (US); Glenn Glass, Beaverton, OR (US); Michael L. Hattendorf, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 759 days.

(21) Appl. No.: 11/448,247

(22) Filed: Jun. 6, 2006

(65) Prior Publication Data

US 2007/0281411 A1 Dec. 6, 2007

(51) Int. Cl.
*H01L 21/336* (2006.01)
(52) U.S. Cl. ............... 438/197; 438/300; 438/607; 257/E21.43
(58) Field of Classification Search ............ 438/197, 438/299, 300, 199, 305, 607; 257/E21.43
See application file for complete search history.

(56) References Cited

U.S. PATENT DOCUMENTS

| | | | |
|---|---|---|---|
| 6,391,749 B1 * | 5/2002 | Park et al. ............ | 438/478 |
| 6,960,781 B2 | 11/2005 | Currie et al. | |
| 7,393,700 B2 * | 7/2008 | Lee et al. ............ | 438/9 |
| 2005/0179066 A1 * | 8/2005 | Murthy et al. ............ | 257/288 |
| 2006/0131665 A1 | 6/2006 | Murthy | |
| 2006/0134872 A1 | 6/2006 | Hattendorf | |
| 2006/0234488 A1 * | 10/2006 | Kim et al. ............ | 438/607 |

OTHER PUBLICATIONS

Kah Wee Ang et al., Enhanced Performance in 50 nm N-MOSFETs with Silicon-Carbon Source/Drain Regions, IEDM 04, 2004 IEEE, pp. 1069-1071.

* cited by examiner

*Primary Examiner*—Michael Trinh
(74) *Attorney, Agent, or Firm*—Blakely, Sokoloff, Taylor & Zafman LLP

(57) ABSTRACT

A method to form a strain-inducing three-component epitaxial film is described. In one embodiment, the strain-inducing epitaxial film is formed by a multiple deposition/etch step sequence, followed by an amorphizing dopant impurity-implant and, finally, a kinetically-driven crystallization process. In one embodiment, the charge-neutral lattice-substitution atoms are smaller and present in greater concentration than the charge-carrier dopant impurity atoms.

6 Claims, 11 Drawing Sheets

FORMATION OF STRAIN-INDUCING FILMS

BACKGROUND OF THE INVENTION

1) Field of the Invention

The invention is in the field of Semiconductor Devices.

2) Description of Related Art

For the past several years, the performance of semiconductor devices, such as Metal Oxide Semiconductor Field-Effect Transistors (MOS-FETs), has been greatly enhanced by the incorporation of strained silicon regions into the active portions of a semiconductor substrate, e.g. the use of compressively strained silicon channel regions to enhance hole mobility in P-type Metal Oxide Semiconductor Field-Effect Transistors (PMOS-FETs). The presence of such strained silicon regions may greatly enhance the rate at which charge migrates in a channel when a semiconductor is in an ON state.

FIG. 1 depicts a typical strained PMOS-FET 100 fabricated on a substrate 102. A gate dielectric layer 104 sits above a channel region 106 and a gate electrode 108 sits above gate dielectric layer 104. Gate dielectric layer 104 and gate electrode 108 are isolated by gate isolation spacers 110. Tip extensions 112 are formed by implanting dopant atoms into substrate 102. Strain-inducing source/drain regions 120 are formed by selectively growing an epitaxial film in etched-out portions of substrate 102 and are doped either in situ or after epitaxial film growth, or both. Strain-inducing source/drain regions are comprised of a material with a larger lattice constant than that of the channel region 106. In typical PMOS-FETs, the channel region 106 is comprised of crystalline silicon, while the strain-inducing source/drain regions 120 are comprised of epitaxial silicon/germanium which has a larger lattice constant than that of crystalline silicon. Strain-inducing source/drain regions 120 can invoke a uniaxial compressive strain on the channel region 106. Such a compressive strain in the channel region 106 can enhance the hole mobility in the channel region 106 of PMOS-FET 100, lending to improved performance of the device.

FIGS. 2A-C illustrate a typical process flow for forming strain-inducing source/drain regions in a PMOS-FET. Referring to FIG. 2A, a non-strained PMOS-FET 200 is first formed. Non-strained PMOS-FET 200 is comprised of a channel region 206. A gate dielectric layer 204 sits above the channel region 206 and a gate electrode 208 sits above gate dielectric layer 204. Gate dielectric layer 204 and gate electrode 208 are isolated by gate isolation spacer 210. Tip extensions 212 and source/drain regions 214 are formed by implanting dopant atoms into substrate 202. Thus, the source/drain regions 214 are initially formed from the same material as the channel region 206. Therefore, the lattice mismatch between the source/drain regions 214 and the channel region 206 is negligible, resulting in effectively no strain on the channel region 206. Referring to FIG. 2B, portions of substrate 202, including source/drain regions 214, are removed, e.g. by an etch process, to form recessed regions 216 in substrate 202. Subsequently, strain-inducing source/drain regions 220 are formed by selectively growing an epitaxial film into recessed regions 216, as depicted in FIG. 2C. Strain-inducing source/drain regions 220 can be doped with charge-carrier atoms, e.g. boron in the case of a PMOS-FET, which may be done in situ or after epitaxial film growth, or both. In an example, substrate 202, and hence channel region 206, is comprised of crystalline silicon and the film grown to form strain-inducing source/drain regions 220 is comprised of epitaxial silicon/germanium. The lattice constant of the epitaxial silicon/germanium film can be greater than that of crystalline silicon by a factor of ~1% (for 70% Si, 30% Ge) and so strain-inducing source/drain regions 220 are comprised of a material with a larger lattice constant than that of the channel region 206. Therefore, a uniaxial compressive strain, depicted by the arrows in FIG. 2C, is rendered on channel region 206 in PMOS-FET 230, which can enhance hole mobility in the device.

In order to improve performance in N-type Metal Oxide Semiconductor Field-Effect Transistors (NMOS-FETs), a uniaxial tensile strain may be required to enhance electron mobility in the channel region. This may require incorporation of strain-inducing source/drain regions with a smaller lattice constant than that of the channel region. For example, epitaxial carbon-doped silicon source/drain regions may be desirable for NMOS-FETs with a crystalline silicon channel region because the lattice constant of epitaxial carbon-doped silicon is smaller than that of crystalline silicon. However, selective deposition of an epitaxial carbon-doped silicon film with phosphorus dopant impurity atoms can be difficult. Furthermore, subsequent incorporation of N-type dopants, e.g. phosphorus, into such an epitaxial carbon-doped silicon film may modify the film by displacing the lattice-incorporated carbon atoms. Such displacement of lattice-incorporated carbon atoms may reduce the lattice constant differential between the resulting source/drain regions and the channel region, effectively mitigating any performance-enhancing strain induced on the channel region. Thus, a method to fabricate an N-type epitaxial carbon-doped silicon film is described herein.

DETAILED DESCRIPTION

Figure 1:
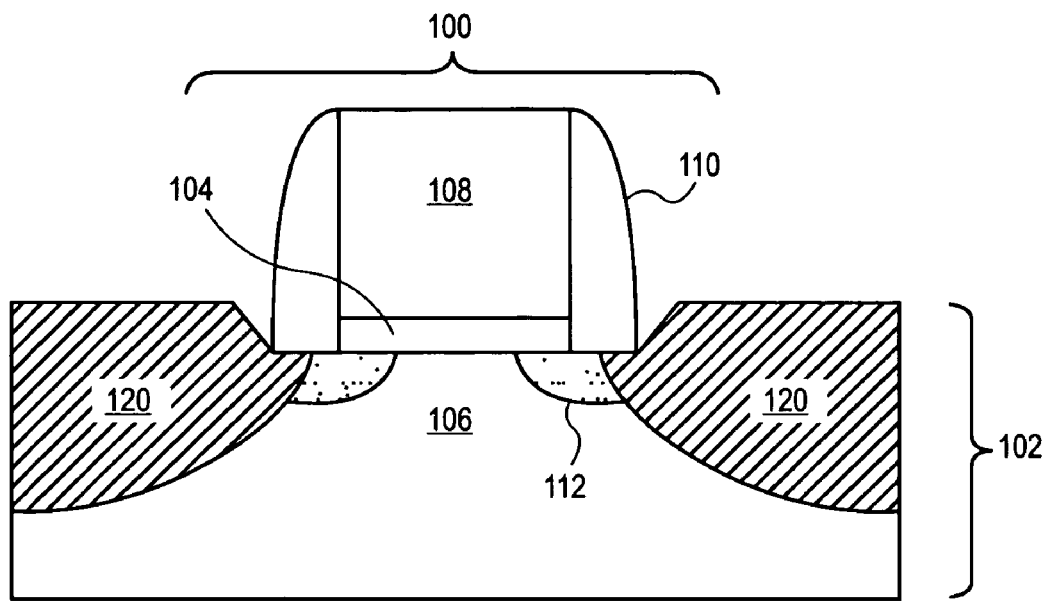
FIG. 1 illustrates a cross-sectional view of a strained P-type Metal Oxide Semiconductor Field-Effect Transistor (PMOS-FET), in accordance with the prior art.
Figure 2A:
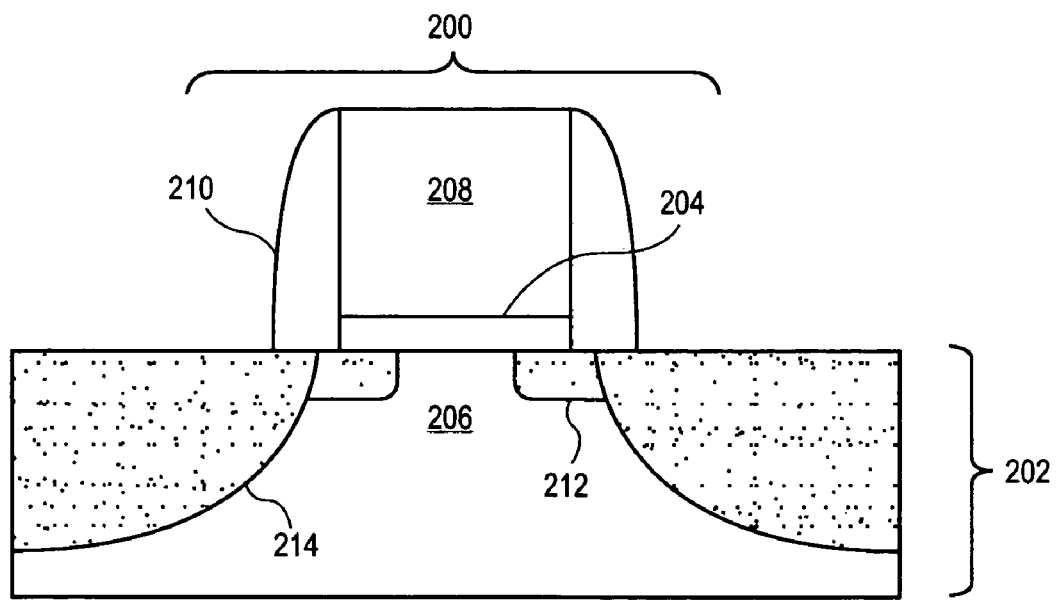
FIGS. 2A-C illustrate cross-sectional views representing the formation of a PMOS-FET with strain-inducing source/drain regions, in accordance with the prior art.
Figure 2B:
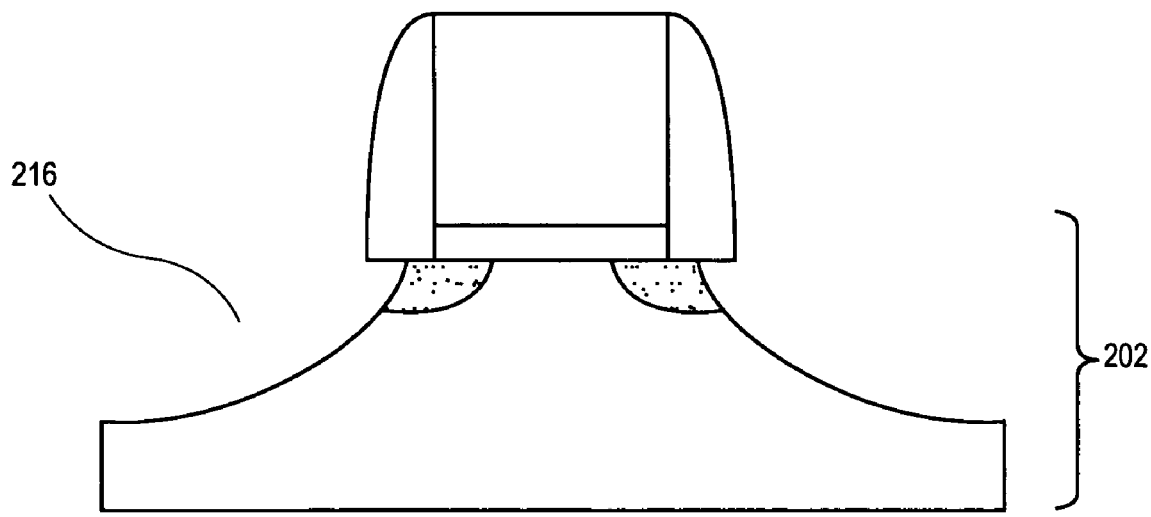
Figure 2C:
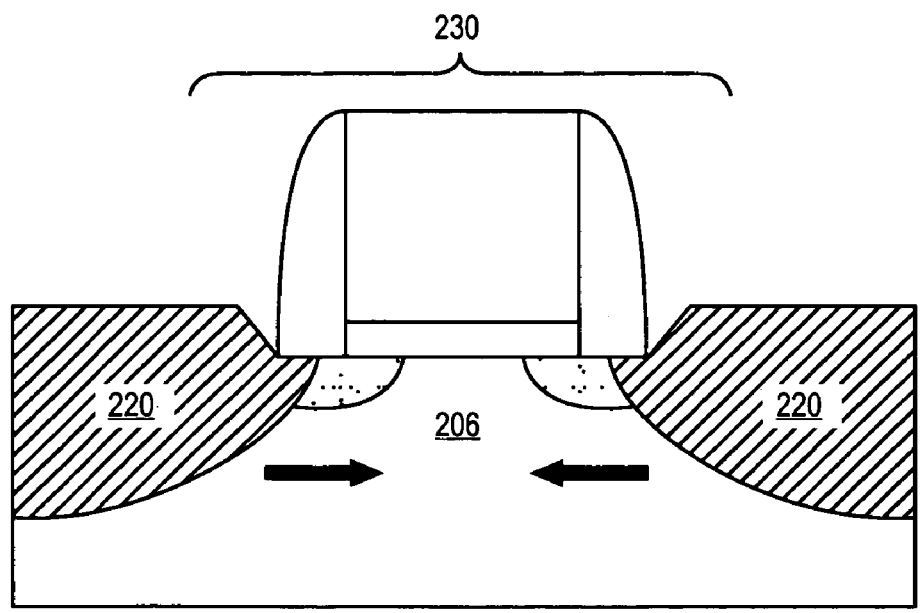

A process for fabricating semiconductor devices and the resultant devices are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the figures are illustrative representations and are not necessarily drawn to scale.

Disclosed herein is a method to form a three-component, strain-inducing epitaxial film. Formation of the strain-inducing epitaxial film by a multiple deposition/etch step sequence, followed by an amorphizing dopant impurity-implant, and finally a kinetically-driven crystallization process may enable a much higher strain and doping activation than that achieved by other methods. For example, an epitaxial carbon-doped silicon film fabricated in this way may incorporate a substantial amount of phosphorus as an N-type dopant while maintaining a significant amount of carbon atoms substituted in the silicon lattice. The lattice constant of the epitaxial N-type carbon-doped silicon film may be smaller than the lattice constant of the crystalline silicon located in the channel region, resulting in a tensile strain induced in the channel region and in the carbon-doped silicon film. An NMOS-FET with source/drain regions comprised of such an epitaxial N-type carbon-doped silicon film and a channel region comprised of crystalline silicon may have an enhanced electron mobility in the channel region when in an ON state.

A deposition sequence involving multiple deposition/etch steps may be used to deposit an epitaxial film in a selective manner. For example, the deposition of an epitaxial carbon-doped silicon film by chemical vapor deposition may comprise such multiple deposition/etch steps. In accordance with an embodiment of the present invention, a thin film is deposited in a process chamber non-selectively on a substrate comprising both amorphous dielectric regions and crystalline regions. Due to the differential incubation time involved in forming stable nuclei on the crystalline regions (faster) versus on the dielectric regions (slower), a non-masked etch process carried out in the same chamber immediately following the deposition process may be used to selectively remove the portions of the deposited film that are on the dielectric regions. Thus, the instable nuclei (those nuclei that have yet to stabilize) are removed from the amorphous dielectric regions, while a thin stable epitaxial film is retained on the crystalline regions. In accordance with an embodiment of the present invention, the multiple deposition/etch sequence is used to provide an epitaxial film of a desired thickness that resides on crystalline regions of a substrate, but not on the dielectric regions. Thus, by selecting an appropriate number of deposition/etch steps, an epitaxial film may be formed selectively (in desired locations) at a desired thickness.

Charge-carrier dopant impurities, e.g. phosphorus or boron, may be implanted into a crystalline substrate or an epitaxial film. Such an implant process may damage a substrate or an epitaxial film severely, effectively forming dopant impurity-containing amorphous regions and/or films. In accordance with an embodiment of the present invention, a three-component amorphous film is formed by implanting a two-component epitaxial film (formed by a multiple deposition/etch step process) with dopant impurity atoms. In accordance with another embodiment of the present invention, the carbon-atoms in a carbon-doped silicon film act to suppress diffusion of implanted charge carrier phosphorus dopant impurities, enabling incorporation of a high concentration of dopant impurities. Thus, a low-resistivity semiconductor region may be formed.

Figure 3:
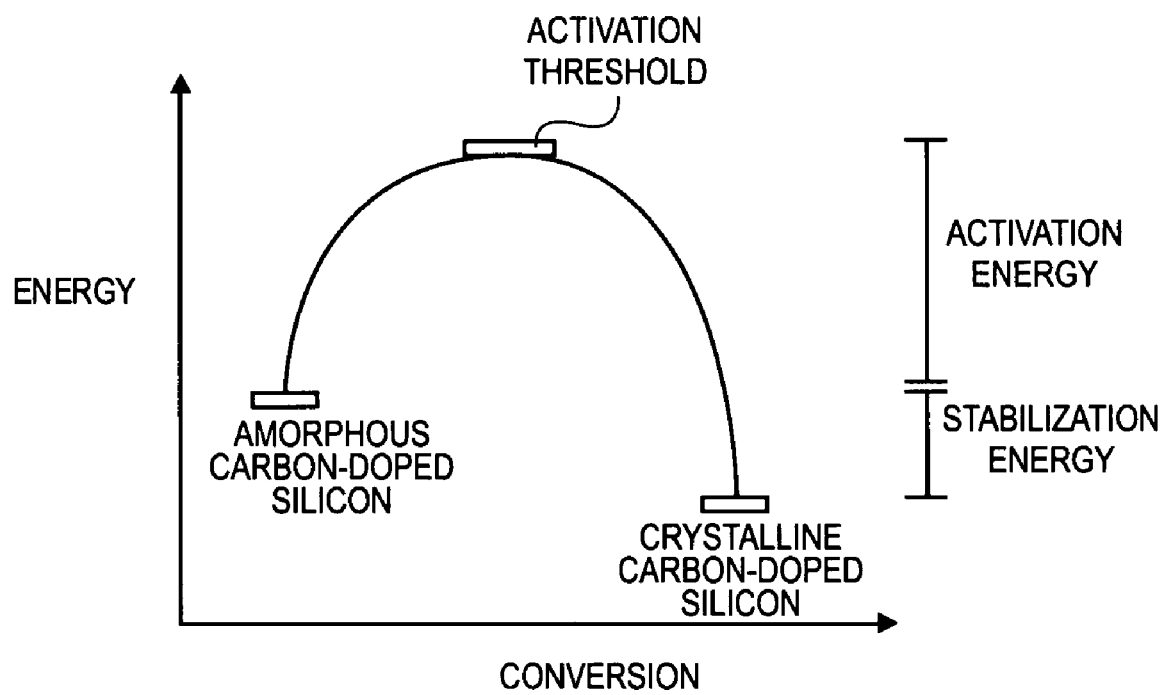
FIG. 3 illustrates an energy/conversion representation of the energy states of amorphous carbon-doped silicon versus crystalline carbon-doped silicon, in accordance with an embodiment of the present invention.

For many semiconductor device applications, it may be necessary that the three-component dopant impurity-containing film exist in a crystalline form. Kinetically-driven crystallization is a method in which a material is heated above the activation threshold, quickly caused to reorganize on an atomic level, and subsequently cooled. The new solid phase formed may be a crystallized phase, such as a single-crystal phase, that is thermodynamically more stable than the starting phase. Because the reorganization is caused to occur quickly, the new solid phase formed may not be the thermodynamically most stable solid phase, so it is thus referred to as the kinetic solid phase product. In effect, a local energy minima may be achieved for the crystallized solid phase, but the local energy minima may not indeed be the global energy minima for the crystallized solid phase. Kinetically-driven crystallization is particularly useful for circumstances where an amorphous film needs to be converted to a meta-stable crystalline film. The energy state of the crystalline phase for a given film is often more stable than that of the corresponding amorphous phase, such that the conversion is practically irreversible. As an example, FIG. 3 illustrates an energy/conversion representation of the energy states of amorphous carbon-doped silicon versus crystalline carbon-doped silicon. The thermodynamic energy state of the crystallized carbon-doped silicon film is more stable (lower in total energy) than the corresponding thermodynamic energy state of the amorphous film (higher in energy). The difference in energy between the two states is the stabilization energy, resulting from the conversion from an amorphous state to a crystalline state. Referring to FIG. 3, the activation threshold must be surpassed to invoke the conversion from amorphous state to crystalline state. Thus, the requisite activation energy must be provided to the overall system to enable the atomic reorganization, forming a more stable film. The requisite activation energy may be provided in the form of a thermal anneal process, such as a laser or a flash anneal process. In accordance with an embodiment of the present invention, an epitaxial film deposited selectively on crystalline regions of a substrate by a multiple deposition/etch step process is amorphized with dopant-impurity atoms and is subsequently crystallized by a kinetically-driven crystallization process.

Upon cooling, a selectively deposited two-component kinetically-driven crystallized film may form an epitaxial film which incorporates dopant impurities into its lattice. Thus, a selectively deposited three-component epitaxial system may be formed. Specifically, a three-component epitaxial film containing charge-neutral lattice-substitution atoms (e.g. carbon in silicon) and charge-carrier dopant impurities may be formed. For example, in accordance with an embodiment of the present invention, an epitaxial carbon-doped silicon film is formed which comprises phosphorus charge-carrier dopant impurities. Thus, the charge-neutral lattice-substitution atoms may be smaller and present in greater concentration than the charge-carrier dopant impurities. In accordance with an embodiment of the present invention, an epitaxial silicon film containing carbon lattice-substitution atoms (i.e. a carbon-doped epitaxial silicon film) and phosphorus charge-carrier dopant impurities is formed in an etched-out region of a crystalline silicon substrate. In one embodiment, the concentration of lattice-substituting carbon atoms in a silicon-based epitaxial film is in the range of 0.5%-3% of the total film atomic composition. In another embodiment, the concentration of the phosphorus charge-carrier dopant impurities in a silicon-based epitaxial film is in the range of 2E19 atoms/$cm^3$-2E21 atoms/$cm^3$. In one embodiment, the concentration of lattice-substituting carbon atoms in a silicon-based epitaxial film is about 1% of the total film atomic composition and the concentration of the phosphorus charge-carrier dopant impurities is between 2E20 atoms/$cm^3$-2E21 atoms/$cm^3$. In another embodiment, the lattice constant of the three-component epitaxial film is in the range of 0.1%-1.0% smaller than the lattice constant for crystalline silicon. Thus, a tensile strain may be induced on a silicon lattice that incorporates such a three-component epitaxial carbon-doped silicon film with phosphorus dopant impurities.

As an example of one embodiment of the present invention, FIGS. 4A-I illustrate the formation of a three-component epitaxial film in an etched out region of a crystalline substrate.

Figure 4A:
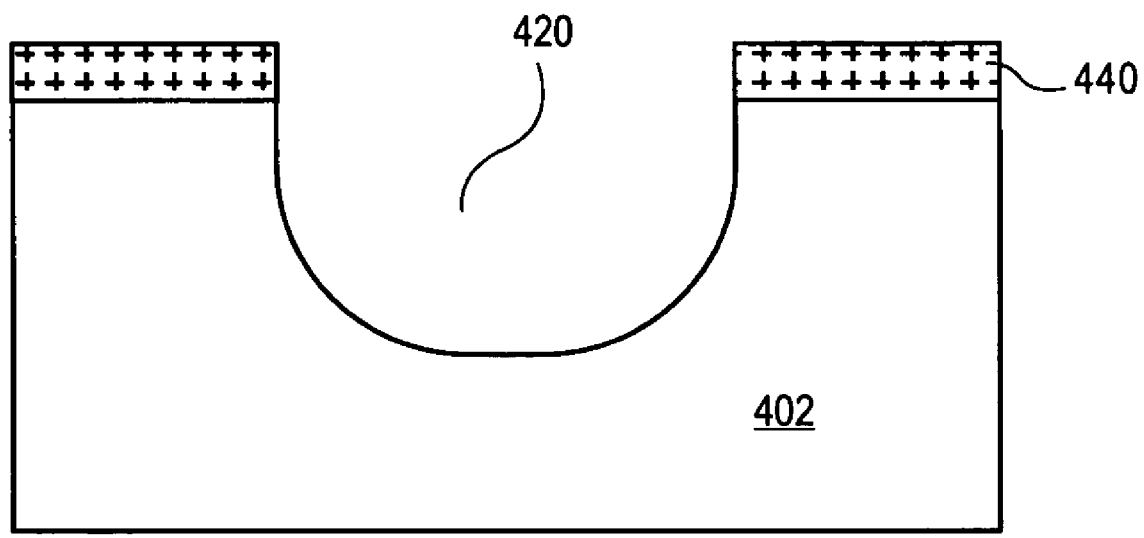
FIGS. 4A-I illustrate cross-sectional views representing the formation of a three-component epitaxial film in an etched out region of a crystalline substrate, in accordance with an embodiment of the present invention.

A multiple deposition/etch step sequence, followed by an amorphizing dopant impurity-implant and, finally, a kinetically-driven crystallization process is illustrated. Referring to FIG. 4A, a region of crystalline substrate 402 between amorphous dielectric regions 440 may be removed to form etched-out region 420. In one embodiment of the present invention, crystalline substrate 402 is a crystalline silicon substrate, a doped crystalline silicon substrate, or an epitaxial silicon layer grown atop a distinct crystalline silicon substrate. In another embodiment, crystalline substrate 402 is comprised of germanium or a III-V material such as but not limited to gallium nitride, gallium phosphide, gallium arsenide, indium phosphide or indium antimonide. In one embodiment, amorphous dielectric region is comprised of silicon dioxide, silicon nitride, silicon oxy-nitride, carbon-doped silicon oxide or nitride, or a high-K dielectric layer. In one embodiment of the present invention, etched out region 420 is formed by first masking crystalline substrate 402 with a masking layer and then etching any exposed portions of crystalline substrate 402 with a dry etch or wet etch process. In an embodiment, etched out region 420 is formed by a dry plasma etch using $NF_3$, HBr, $SF_6/Cl$ or $Cl_2$ or a wet etch using $NH_4OH$ or tetramethylammonium hydroxide. In another embodiment, etched-out region 420 is formed with an in situ $Cl_2$ or HCl etch in a deposition chamber using 100-500 sccm $Cl_2$ or HCl in hydrogen carrier gas at a pressure in the range of 10-500 torr at a temperature in the range of 775° C.-900° C. for a duration in the range of 10 seconds-2 minutes.

Referring to FIGS. 4B-F, an epitaxial region 408 may be formed in etched-out region 420 of crystalline substrate 402. In one embodiment, epitaxial region 408 is a two-component epitaxial region. In an embodiment, epitaxial region 408 is an epitaxial carbon-doped silicon layer formed in a crystalline silicon substrate 402. Epitaxial region 408 may be deposited by any suitable selective deposition technique that enables formation on crystalline substrate 402 but not on amorphous dielectric regions 440. In accordance with an embodiment of the present invention, epitaxial region 408 is selectively formed by depositing thin epitaxial layers by multiple deposition/etch steps, as depicted in FIGS. 4B-E.

Figure 4B:
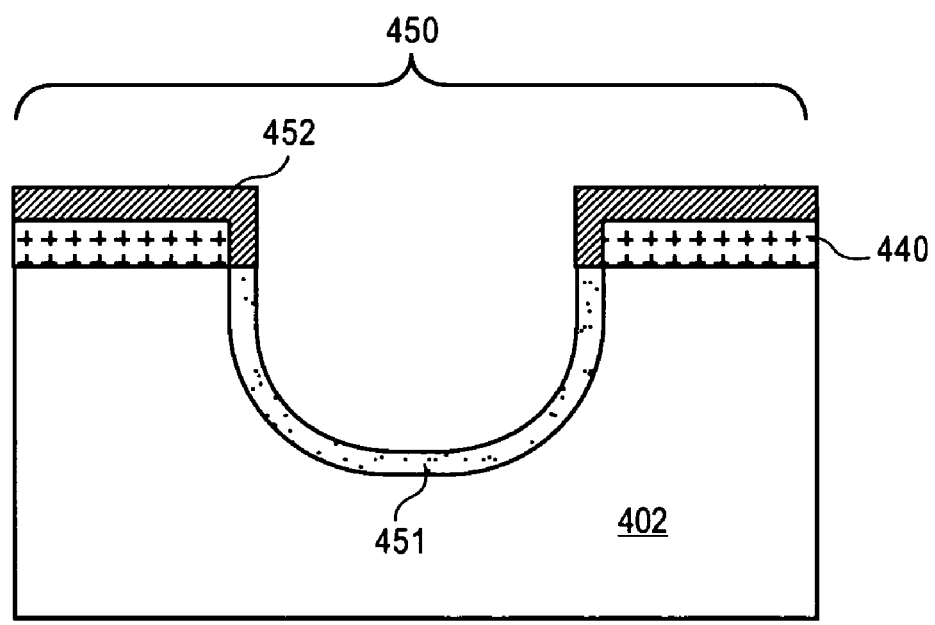
Figure 4C:
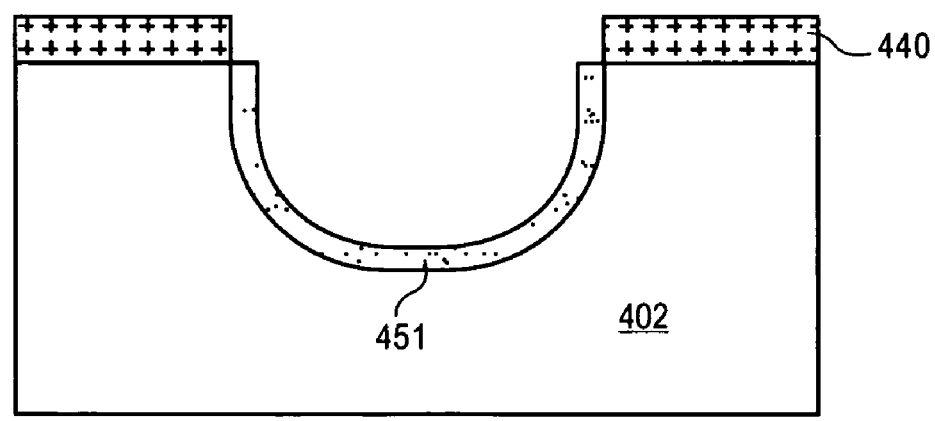
Figure 4D:
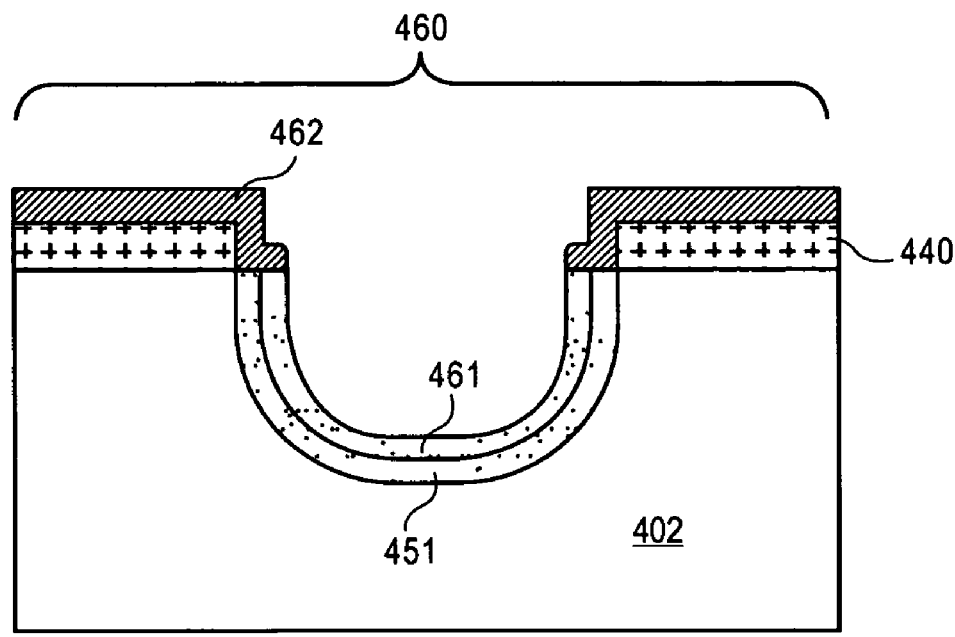
Figure 4E:
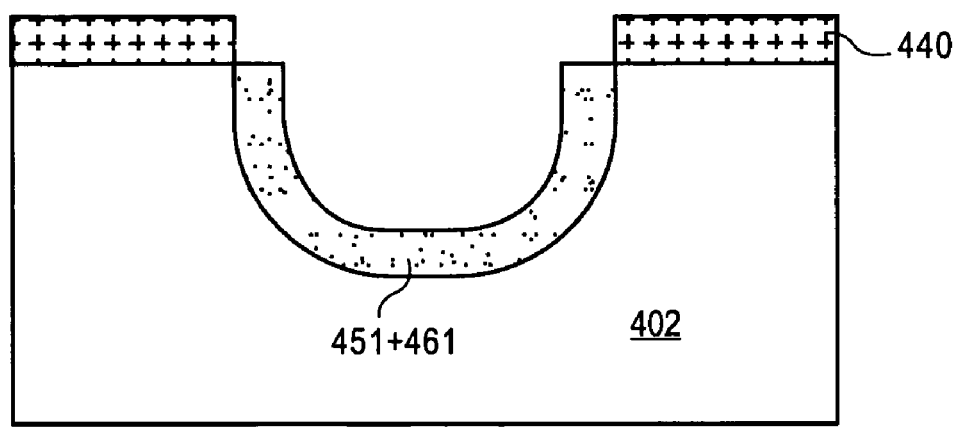
Figure 4F:
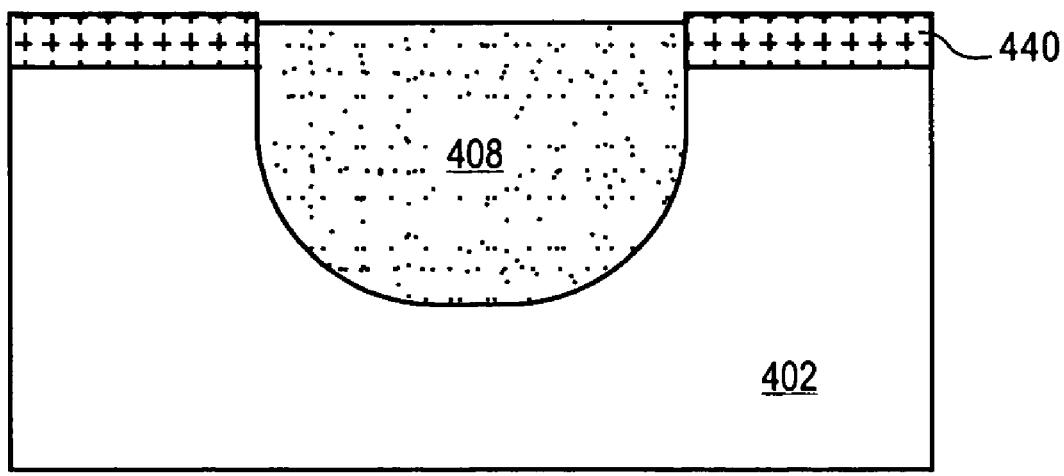

Referring to FIG. 4B, a thin epitaxial layer 450 is deposited non-selectively on amorphous dielectric regions 440 and in etched-out region 420. Thin epitaxial layer 450 may be comprised of a portion 451 containing stable nuclei and a portion 452 containing instable nuclei. In one embodiment, 3-5 Angstroms of carbon-doped silicon is deposited and is subsequently removed from the amorphous dielectric regions 440 by using a $Cl_2$-based etch process, leaving 3-5 Angstroms on the exposed crystalline substrate 402, as depicted in FIG. 4C. Referring to FIG. 4D, a thin epitaxial layer 460 is deposited non-selectively on amorphous dielectric regions 440 and on portion 451 of thin epitaxial layer 450. Thin epitaxial layer 460 may be comprised of a portion 461 containing stable nuclei and a portion 462 containing instable nuclei. In one embodiment, 3-5 Angstroms of carbon-doped silicon is deposited and is subsequently removed from the amorphous dielectric regions 440 by using a $Cl_2$-based etch process, leaving a total of 6-10 Angstroms on the exposed crystalline substrate 402, as depicted in FIG. 4E. In an embodiment, greater than 50 deposition/etch steps are carried out sequentially to form epitaxial region 408 with a thickness of about 1000 Angstroms. In one embodiment, a carbon-doped silicon deposition/etch step is conducted in a chemical vapor deposition chamber using silicon- and carbon-based precursors. In a specific embodiment, the deposition process comprises first flowing the deposition gases $SiH_4$, $CH_3SiH_3$ and $H_2$ in a ratio of 300:55:500 sccm for about 1 minute, second doing a hydrogen gas purge at 1 slm for about 1 minute, third, flowing the etch gases $Cl_2$ and $H_2$ in the ratio 16 sccm:1 slm for about 45 seconds, and finally doing a hydrogen gas purge at 2 slm for about 2 minutes. In an embodiment, the volume of the deposition chamber is approximately 250 L. In another embodiment, the deposition chamber is a single-wafer deposition chamber with a volume of approximately 35 L. In one embodiment, the deposition/etch steps are carried out at a temperature in the range of 525-625 degrees C. In another embodiment, the deposition/etch steps are carried out at a temperature of about 575 degrees C.

Figure 4G:
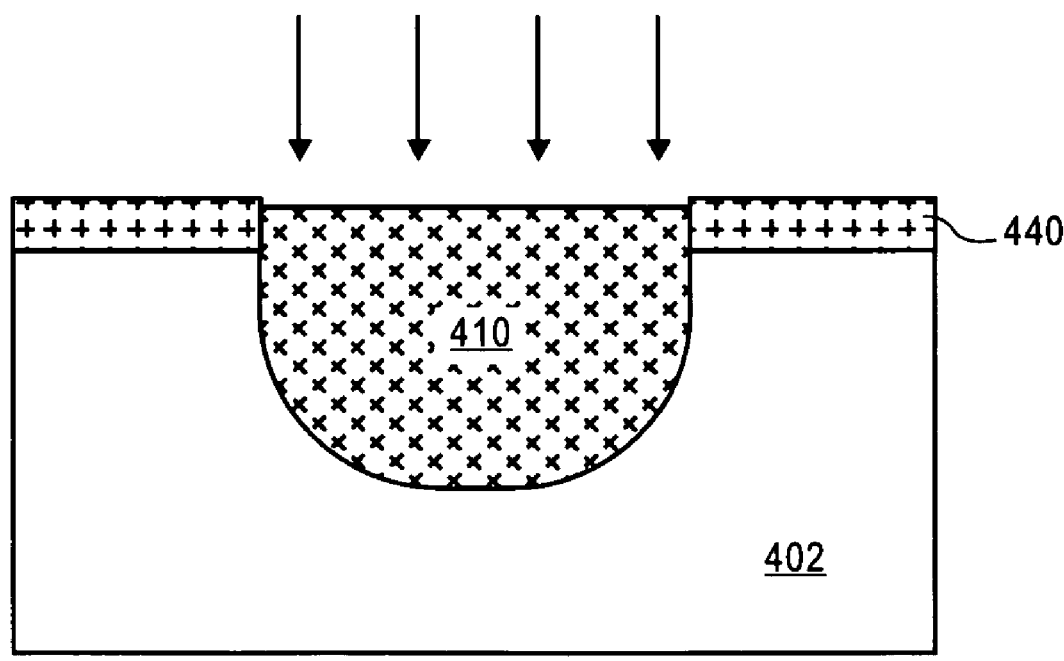

Referring to FIG. 4G, charge-carrier dopant impurities may be implanted into epitaxial region 408 to form three-component amorphous region 410 in crystalline substrate 402. In one embodiment, epitaxial region 408 is comprised of carbon-doped silicon and the charge-carrier dopant impurities are phosphorus atoms. In an embodiment, phosphorus dopant impurity atoms are implanted at a dose in the range of $1E15$ atoms/cm$^2$-$1E17$ atoms/cm$^2$ with an energy in the range of 1 keV-20 keV. In another embodiment, phosphorus dopant impurity atoms are implanted at a dose in the range of $2E15$ atoms/cm$^2$-$5E16$ atoms/cm$^2$ with an energy in the range of 5 keV-10 keV. In one embodiment, the concentration of lattice-substituting carbon atoms in a silicon-based epitaxial film is in the range of 0.5%-3% of the total film atomic composition. In another embodiment, the concentration of the phosphorus charge-carrier dopant impurities in a silicon-based epitaxial film is in the range of $2E19$ atoms/cm$^3$-$2E21$ atoms/cm$^3$. In one embodiment, the concentration of lattice-substituting carbon atoms in a silicon-based epitaxial film is about 1% of the total film atomic composition and the concentration of the phosphorus charge-carrier dopant impurities is between $2E20$ atoms/cm$^3$-$2E21$ atoms/cm$^3$.

Figure 4H:
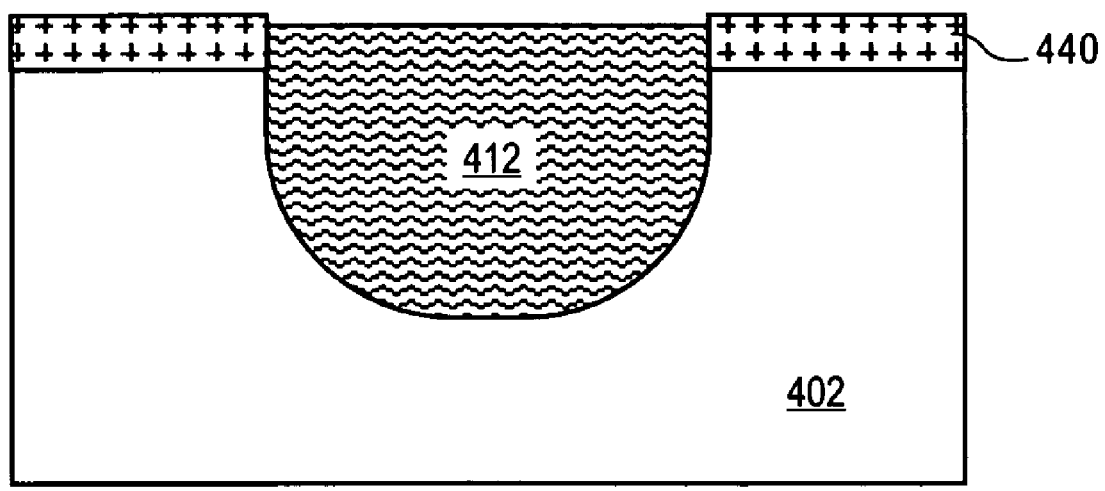

The structure formed in association with FIG. 4G may then be heated to a temperature sufficient to surpass the activation threshold for the conversion of three-component amorphous region 410 to a crystalline form. Referring to FIG. 4H, three-component amorphous region 410 may be heated to form crystalline region 412 within crystalline substrate 402. In accordance with an embodiment of the present invention, three-component amorphous region 410 may be converted to crystalline region 412 by a thermal or flash anneal process or a laser irradiation process. In one embodiment, three-component amorphous region 410 contains silicon, carbon and phosphorus atoms and is heated to a temperature in the range of 1000° C. to 1300° C. for a duration of 10 microseconds-10 milliseconds.

Figure 4I:
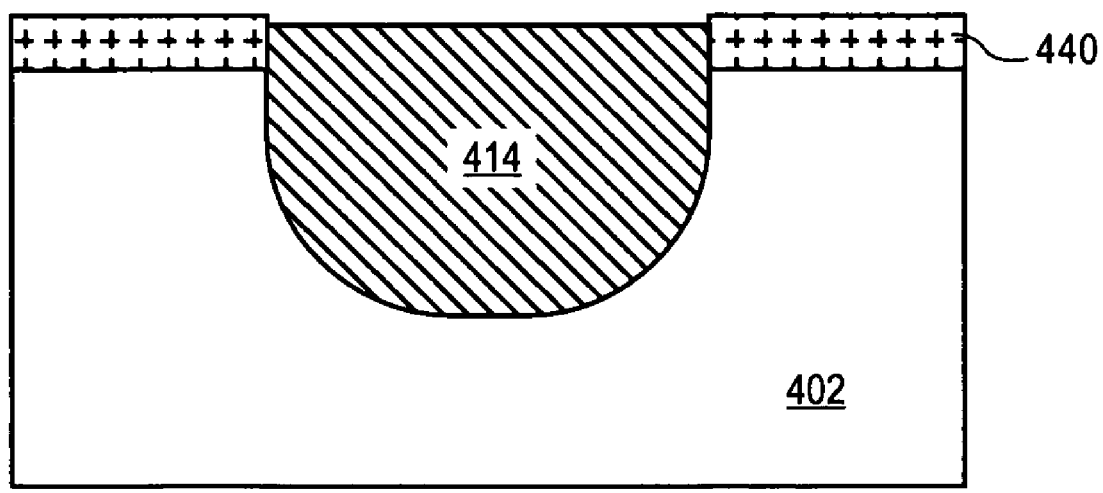

Referring to FIG. 4I, the structure formed in association with FIG. 4H may be cooled to room temperature to form an epitaxial three-component epitaxial region 414. In one embodiment, three-component epitaxial region 414 has a lattice constant smaller than the lattice constant of crystalline substrate 402 and induces a tensile strain on crystalline substrate 402. In another embodiment, three-component epitaxial region 414 has a lattice constant larger than the lattice constant of crystalline substrate 402 and induces a compressive strain on crystalline substrate 402. In one embodiment, three-component crystalline region is comprised of 97-99% silicon atoms, carbon lattice-substitution atoms in a concentration range of 0.5%-3% of the total film atomic composition and phosphorus charge-carrier dopant impurities with a concentration in the range of $2E19$ atoms/cm$^3$-$2E21$ atoms/cm$^3$. In one embodiment, the top surface of three-component epitaxial region 414 is raised above the top surface of crystalline substrate 402, as depicted in FIG. 4I.

A three-component epitaxial film that may be utilized in the fabrication of a semiconductor device may be formed by a multiple deposition/etch step sequence, followed by an amorphizing dopant impurity-implant and, finally, a kinetically-driven crystallization process. In one embodiment, the semiconductor device is a MOS-FET, a bipolar transistor, a memory transistor or a micro-electronic machine (MEM). In another embodiment, the semiconductor device is a planar device or a non-planar device, such as a tri-gate or double-gate transistor. For illustrative purposes, the fabrication of an NMOS-FET device incorporating a strain-inducing three-component epitaxial film formed by a multiple deposition/etch step sequence, followed by an amorphizing dopant impurity-implant, and finally a kinetically-driven crystallization process is described below, in accordance with one embodiment of the present invention.

Figure 5A:
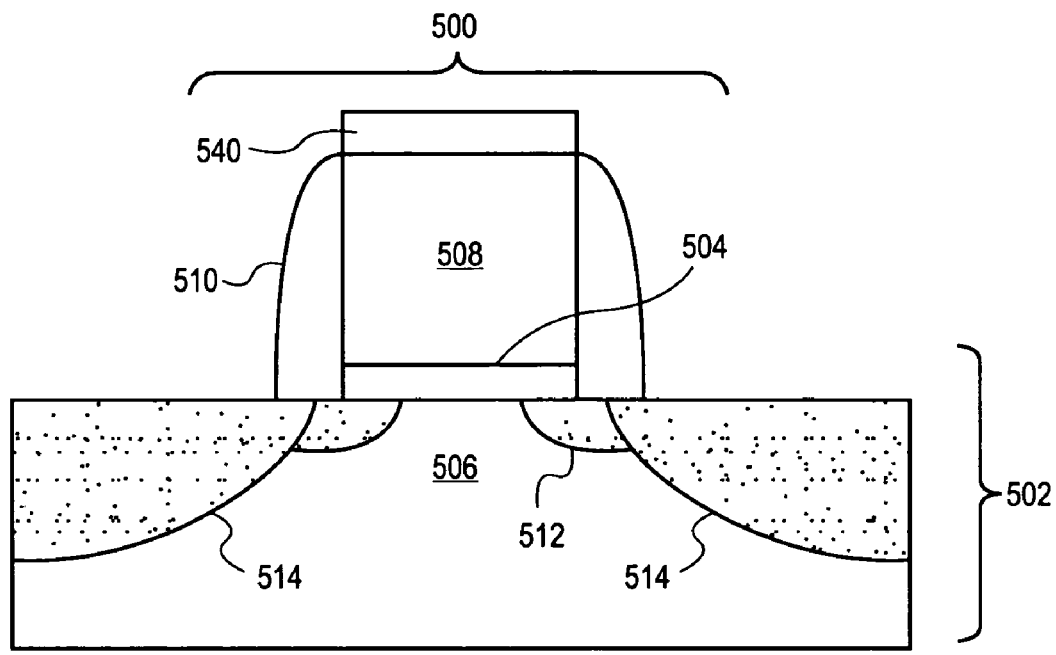
FIGS. 5A-F illustrate cross-sectional views representing the formation of strain-inducing source/drain regions in an NMOS-FET, in accordance with an embodiment of the present invention.

FIGS. 5A-F illustrate a process flow for forming strain-inducing source/drain regions in an NMOS-FET, in accordance with an embodiment of the present invention. Referring to FIG. 5A, a non-strained NMOS-FET 500 is first formed. Non-strained NMOS-FET 500 may be comprised of a channel region 506 in a crystalline substrate 502. In one embodiment of the present invention, crystalline substrate 502 is comprised of crystalline silicon. In another embodiment, crystalline substrate 502 is comprised of an epitaxial silicon layer grown atop a distinct crystalline silicon substrate. In one embodiment, crystalline substrate 502 is comprised of germanium or a III-V material such as but not limited to gallium nitride, gallium phosphide, gallium arsenide, indium phosphide or indium antimonide.

A gate dielectric layer 504 may be formed above channel region 506. In one embodiment, gate dielectric layer 504 is formed by a thermal oxidation process and is comprised of silicon dioxide or silicon oxy-nitride. In another embodiment, gate dielectric layer 504 is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide.

A gate electrode 508 may be formed above gate dielectric layer 504. Gate electrode 508 may be formed by a subtractive etching process scheme or by a replacement gate process scheme. In one embodiment, gate electrode 508 is comprised of a polycrystalline silicon gate electrode, wherein the charge-carrier dopant impurities are implanted during fabrication of the tip and source/drain regions, described below. In another embodiment, gate electrode 508 is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide. In one embodiment, a protective layer 540 is retained above gate electrode 508, as depicted in FIG. 5A.

A tip extension 512 may be formed by implanting charge-carrier dopant impurity atoms into substrate 502. Gate electrode 508 may act to mask a portion of substrate 502 to form self-aligned tip extensions 512. In one embodiment, boron, arsenic, phosphorus, indium or a combination thereof is implanted into substrate 502 to form tip extension 512.

Gate dielectric layer 504 and gate electrode 508 may be isolated by gate isolation spacer 510. Gate isolation spacer 510 may be formed by any suitable technique. In an embodiment, an insulating layer such as but not limited to silicon dioxide, silicon nitride, silicon oxy-nitride or carbon-doped silicon nitride is deposited by a chemical vapor deposition process and is subsequently dry etched. In another embodiment, the thickness of the insulating layer is selected to determine the final width of gate isolation spacer 510. In one embodiment, gate isolation spacer 510 forms a hermetic seal with gate electrode 508 and the top surface of substrate 502 in order to encapsulate gate dielectric layer 504.

A source/drain region 514 may be formed by implanting charge-carrier dopant impurity atoms into substrate 502. Thus, source/drain region 514 may be formed from the same material as channel region 506. Therefore, the lattice mismatch between source/drain region 514 and channel region 506 may be negligible, resulting in effectively no strain induced on channel region 506. Gate isolation spacer 510 and gate electrode 508 may act to shield a portion of substrate 502 during the implant step to form self-aligned source/drain regions 514. In effect, the thickness of gate isolation spacer 510 may play a role in dictating the dimensions of source/drain region 514. In one embodiment, boron, arsenic, phosphorus, indium or a combination thereof is implanted into substrate 502 to form source/drain regions 514.

Figure 5B:
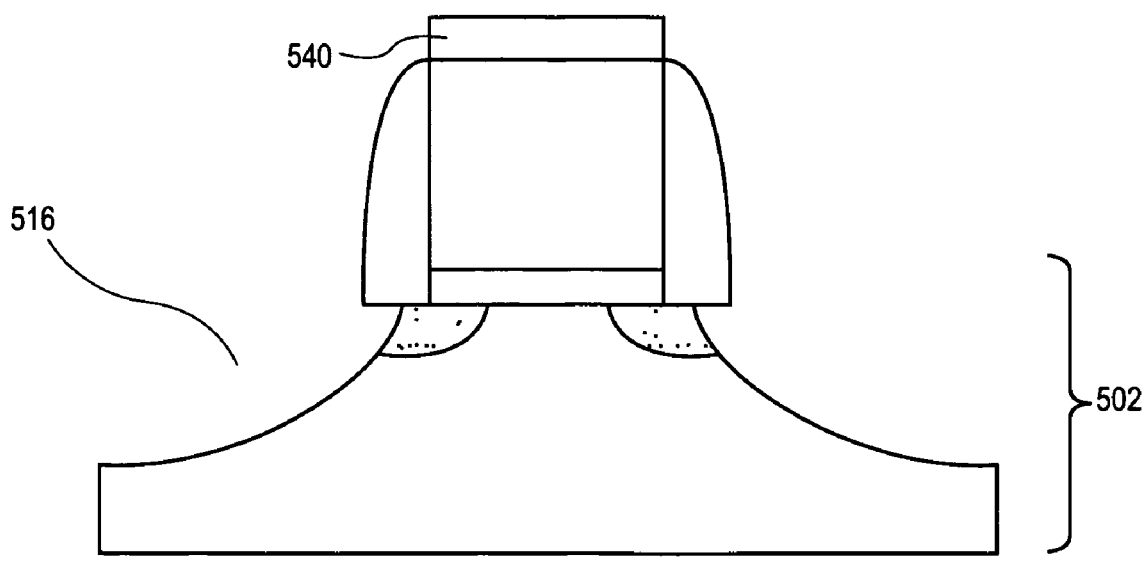

Referring to FIG. 5B, portions of substrate 502, including source/drain regions 514, may be removed to form recessed region 516 in substrate 502. Recessed region 516 may be formed by any suitable technique, such as a dry etch or a wet etch process. In one embodiment, recessed region 516 is formed by a dry plasma etch using $NF_3$, HBr, $SF_6$/Cl or $Cl_2$ or a wet etch using $NH_4OH$ or tetramethylammonium hydroxide. In another embodiment, etched-out region 420 is formed with an in situ $Cl_2$ or HCl etch in a deposition chamber using 100-500 sccm $Cl_2$ or HCl in hydrogen carrier gas at a pressure in the range of 10-500 torr at a temperature in the range of 775° C.-900° C. for a duration in the range of 10 seconds-2 minutes. In one embodiment, protective layer 540 protects gate electrode 508 during the formation of recessed region 516. In another embodiment, recessed region 516 is formed to a depth sufficient to remove the charge-carrier dopant impurities implanted to form source/drain region 514, as depicted in FIG. 5B. In one embodiment, recessed region 516 is further laterally recessed to remove a substantial portion of tip extension 512.

Figure 5C:
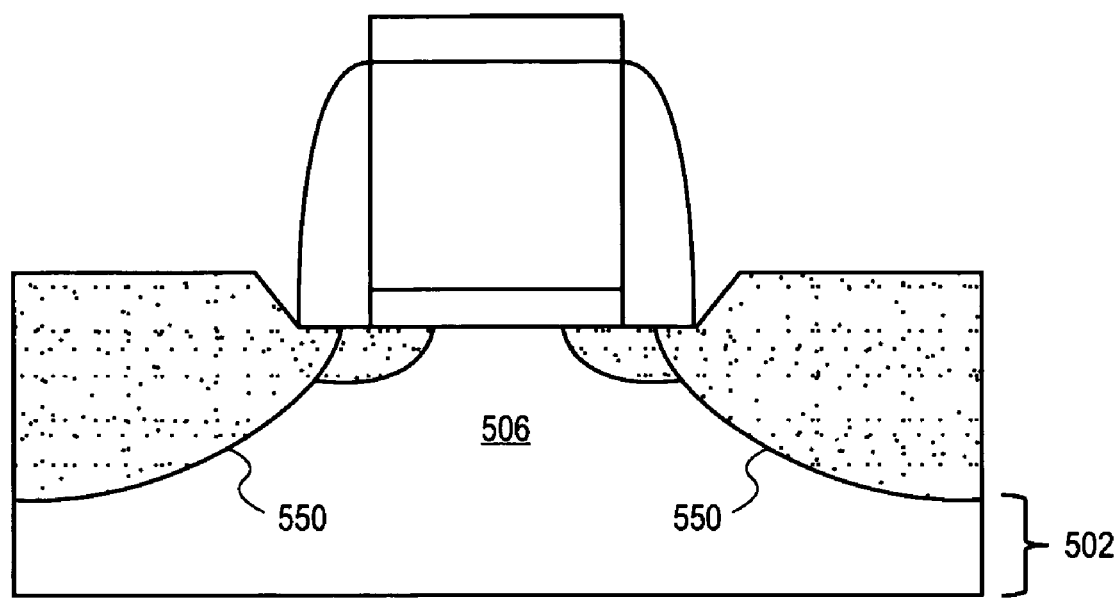

Referring to FIG. 5C, epitaxial region 550 may be formed selectively in recessed region 516. In one embodiment, epitaxial region 550 is a two-component epitaxial region. In another embodiment, epitaxial region 550 is comprised of carbon-doped silicon and channel region 506 is comprised of crystalline silicon. Epitaxial region 550 may be deposited by any suitable selective deposition technique that enables formation on crystalline substrate 502 but not on amorphous dielectric protective layer 540 or amorphous dielectric gate isolation spacers 510. In accordance with an embodiment of the present invention, epitaxial region 550 is selectively formed by depositing thin epitaxial layers by multiple deposition/etch steps, as discussed in conjunction with FIGS. 4B-E above. In one embodiment, 3-5 Angstroms of carbon-doped silicon is deposited in each deposition and is subsequently removed from amorphous dielectric protective layer 540 and amorphous dielectric gate isolation spacers 510 by using a $Cl_2$-based etch process after each deposition step, leaving 3-5 Angstroms on the exposed crystalline substrate 502. In an embodiment, greater than 50 deposition/etch steps are carried out sequentially to form epitaxial region 550 with a thickness of about 1000 Angstroms. In one embodiment, a carbon-doped silicon deposition/etch step is conducted in a chemical vapor deposition chamber using silicon- and carbon-based precursors. In a specific embodiment, the deposition process comprises first flowing the deposition gases $SiH_4$, $CH_3SiH_3$ and $H_2$ in a ratio of 300:55:500 sccm for about 1 minute, second doing a hydrogen gas purge at 1 slm for about 1 minute, third, flowing the etch gases $Cl_2$ and $H_2$ in the ratio 16 sccm:1 slm for about 45 seconds, and finally doing a hydrogen gas purge at 2 slm for about 2 minutes. In an embodiment, the volume of the deposition chamber is approximately 250 L. In another embodiment, the deposition chamber is a single-wafer deposition chamber with a volume of approximately 35 L. In one embodiment, the deposition/etch steps are carried out at a temperature in the range of 525-625 degrees C. In another embodiment, the deposition/etch steps are carried out at a temperature of about 575 degrees C. In one embodiment, the top surface of material region 550 is raised above the top surface of substrate 502, and hence above the top surface of channel region 506, as depicted in FIG. 5C.

Figure 5D:
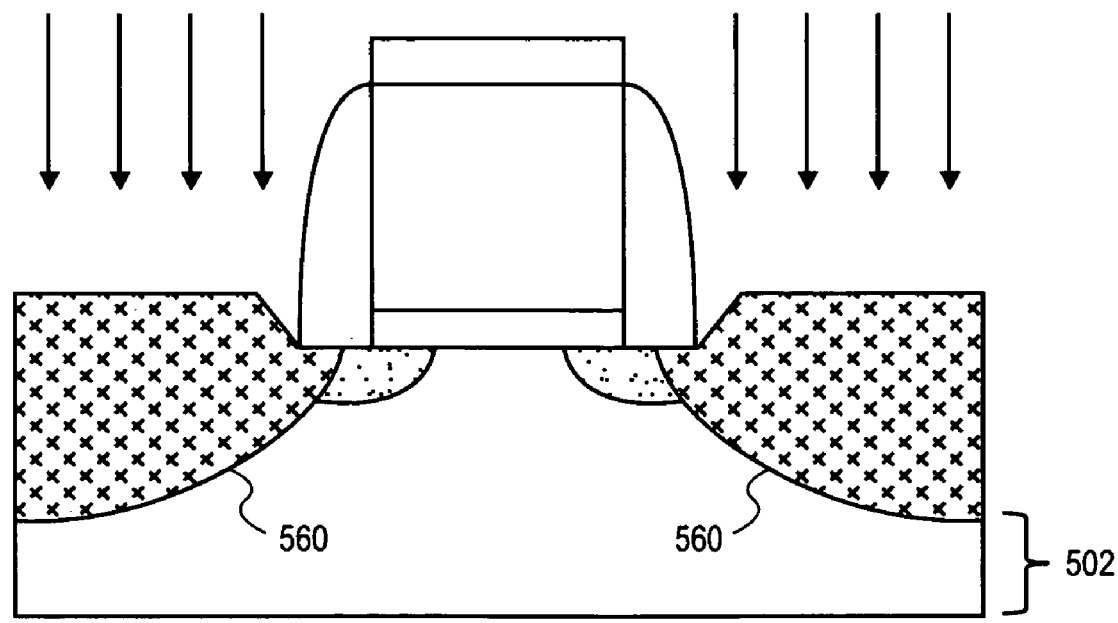

Referring to FIG. 5D, charge-carrier dopant impurities may be implanted into epitaxial region 550 to form three-component amorphous region 560 in crystalline substrate 502. In one embodiment, epitaxial region 550 is comprised of carbon-doped silicon and the charge-carrier dopant impurities are phosphorus atoms. In an embodiment, phosphorus dopant impurity atoms are implanted at a dose in the range of $1E15$ atoms/cm$^2$-$1E17$ atoms/cm$^2$ with an energy in the range of 1 keV-20 keV. In another embodiment, phosphorus dopant impurity atoms are implanted at a dose in the range of $2E15$ atoms/cm$^2$-$5E16$ atoms/cm$^2$ with an energy in the range of 5 keV-10 keV. In one embodiment, the concentration of lattice-substituting carbon atoms in a silicon-based epitaxial film is in the range of 0.5%-3% of the total film atomic composition. In another embodiment, the concentration of the phosphorus charge-carrier dopant impurities in a silicon-based epitaxial film is in the range of $2E19$ atoms/cm$^3$-$2E21$ atoms/cm$^3$. In one embodiment, the concentration of lattice-substituting carbon atoms in a silicon-based epitaxial film is about 1% of the total film atomic composition and the concentration of the phosphorus charge-carrier dopant impurities is between $2E20$ atoms/cm$^3$-$2E21$ atoms/cm$^3$.

Figure 5E:
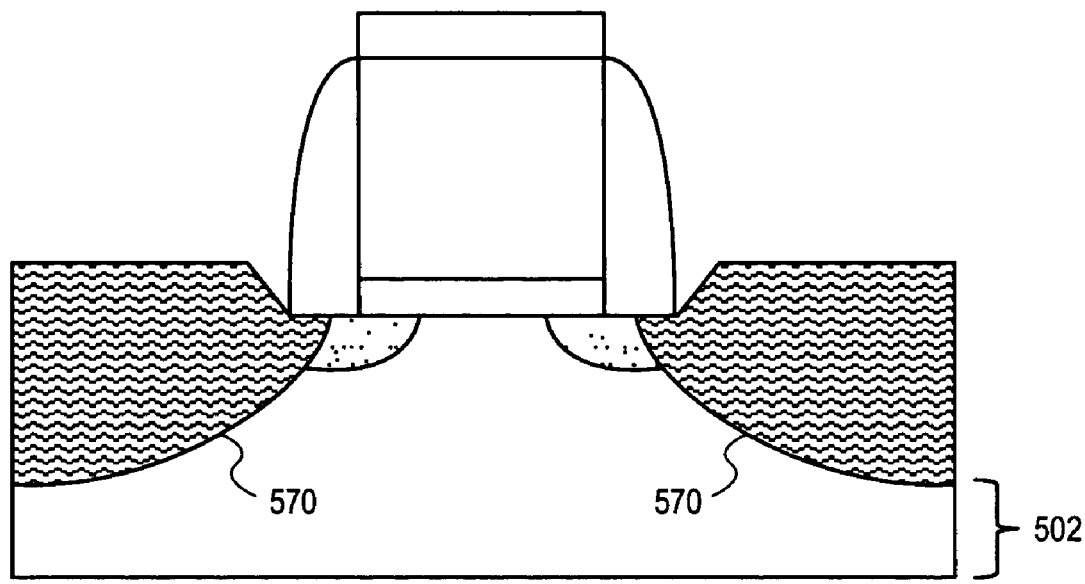

The structure formed in association with FIG. 5D may then be heated to a temperature sufficient to surpass the activation threshold for the conversion of three-component amorphous region 560 to a crystalline form. Referring to FIG. 5E, three-component amorphous region 560 may be heated to form crystalline region 570 within crystalline substrate 502. In accordance with an embodiment of the present invention, three-component amorphous region 560 may be converted to crystalline region 570 by a thermal or flash anneal process or a laser irradiation process. In one embodiment, three-component amorphous region 570 contains silicon, carbon and phosphorus atoms and is heated to a temperature in the range of 1000° C. to 1300° C. for a duration of 10 microseconds-10 milliseconds.

Figure 5F:
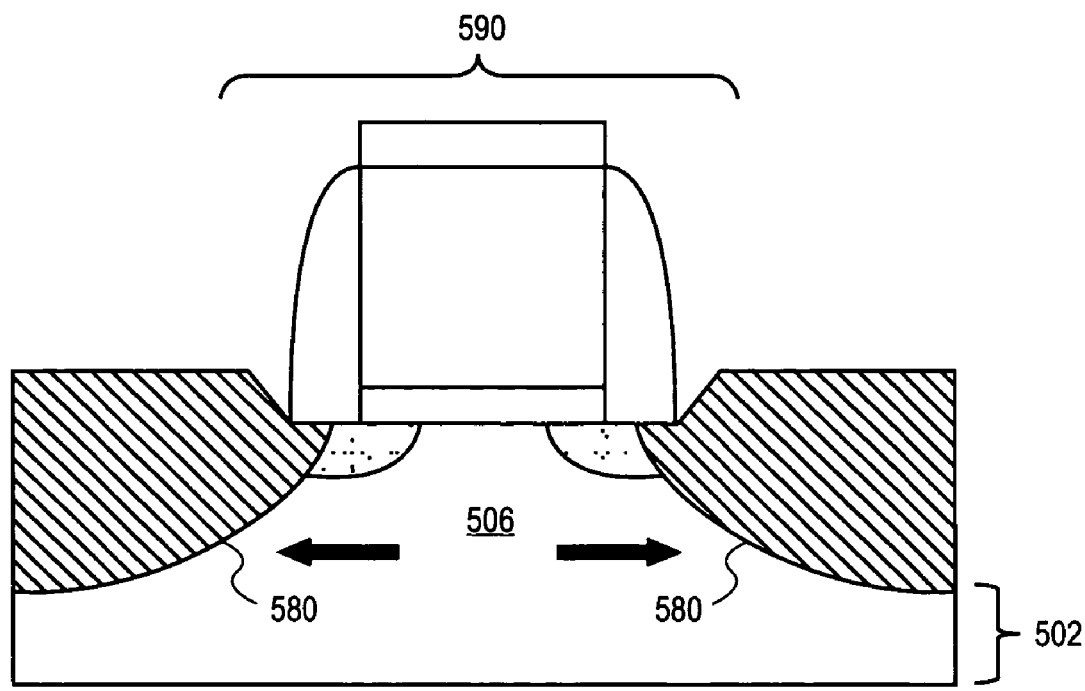

Referring to FIG. 5F, the structure formed in association with FIG. 5E may be cooled to room temperature to form an epitaxial three-component epitaxial region 580. In one embodiment, three-component epitaxial region 580 has a lattice constant smaller than the lattice constant of substrate 502, and hence channel region 506, and induces a tensile strain on channel region 506. In one embodiment, three-component crystalline region is comprised of 97-99% silicon atoms, carbon lattice-substitution atoms in a concentration range of 0.5%-3% of the total film atomic composition and phosphorus charge-carrier dopant impurities with a concentration in the range of $2E19$ atoms/cm$^3$-$2E21$ atoms/cm$^3$. In one embodiment, the top surface of three-component crystalline region 580 is raised above the top surface of crystalline substrate 502, as depicted in FIG. 5F.

Three-component epitaxial region 580 may function as a source/drain region and thus NMOS-FET 590 in FIG. 5F may comprise strain-inducing source/drain regions. Therefore, a uniaxial tensile strain, depicted by the arrows in FIG. 5F, may be rendered on channel region 506 in NMOS-FET 590, which can enhance electron mobility in the device. In one embodiment, the top surface of three-component epitaxial region 580 is raised above the top surface of substrate 502, and hence above the top surface of channel region 506, as depicted in FIG. 5F. In another embodiment, three-component epitaxial region 580 also functions as a tip extension. NMOS-FET 590 may subsequently be integrated into an integrated circuit by conventional process steps, as known in the art.

The present invention is not limited to the formation of NMOS-FET devices with strain-inducing source/drain regions and/or tip extensions. In accordance with another embodiment of the present invention, a PMOS-FET comprising strain-inducing source/drain regions may be fabricated in a manner similar to that illustrated in FIGS. 5A-F. In an embodiment, a three-component epitaxial region has a lattice constant larger than the lattice constant of the channel region and thus induces a compressive strain on the channel region. In one embodiment, three-component epitaxial region is an epitaxial silicon/germanium film with a germanium atomic concentration in the range of 10%-30% of the total film atomic composition and boron charge-carrier dopant impurity atoms with a concentration in the range of $2E19$ atoms/cm$^3$-$2E21$ atoms/cm$^3$.

Thus, a method to form a three-component epitaxial film has been disclosed. In an embodiment, the three-component epitaxial film comprises atoms from a parent film, charge-neutral lattice-substitution atoms and charge-carrier dopant impurity atoms. In one embodiment, the charge-neutral lattice-substitution atoms are smaller and present in greater concentration than the charge-carrier dopant impurity atoms. In one embodiment, the charge-neutral lattice-substitution atoms are larger and present in greater concentration than the charge-carrier dopant impurity atoms. In another embodiment, a strain-inducing epitaxial film comprises a three-component epitaxial film. In one embodiment, the strain-inducing epitaxial film is formed by formed by a multiple deposition/etch step sequence, followed by an amorphizing dopant impurity-implant and, finally, a kinetically-driven crystallization process.

What is claimed is:

1. A method of forming a semiconductor structure comprising:

forming a substrate comprising an amorphous region and a crystalline region;

depositing non-selectively in a process chamber a two-component epitaxial layer above said amorphous region and above said crystalline region of said substrate, wherein said two-component epitaxial layer is comprised of carbon-doped silicon, and wherein the depositing of said two-component epitaxial layer comprises first flowing the deposition gases SiH$_4$, CH$_3$SiH$_3$ and H$_2$ in a ratio of 300:55:500 sccm for about 1 minute and then doing a hydrogen gas purge at 1 slm for about 1 minute; and then, without removing said substrate from said chamber, etching in said process chamber said two-component epitaxial layer, wherein the etching of said two-component epitaxial layer comprises first flowing the etch gases Cl$_2$ and H$_2$ in the ratio 16 sccm:1 slm for about 45 seconds and then doing a hydrogen gas purge at 2 slm for about 2 minutes, wherein etching said two-component epitaxial layer removes the portion of said two-component epitaxial layer above said amorphous region of said substrate, and wherein etching said two-component epitaxial layer does not remove the portion of said two-component epitaxial layer above said crystalline region of said substrate.

2. The method of claim 1 wherein said process chamber is held at a temperature in the range of 525-625 degrees C. during the depositing and etching steps.

3. A method of forming a semiconductor structure comprising:

forming a substrate comprising an amorphous region and a crystalline region;

depositing non-selectively in a process chamber a two-component epitaxial layer above said amorphous region and above said crystalline region of said substrate, wherein said two-component epitaxial layer is comprised of carbon-doped silicon, and wherein the depositing of said two-component epitaxial layer comprises first flowing the deposition gases $SiH_4$, $CH_3SiH_3$ and $H_2$ in a ratio of 300:55:500 sccm for about 1 minute and then doing a hydrogen gas purge at 1 slm for about 1 minute; and then, without removing said substrate from said chamber, etching in said process chamber said two-component epitaxial layer, wherein etching said two-component epitaxial layer removes the portion of said two-component epitaxial layer above said amorphous region of said substrate, wherein etching said two-component epitaxial layer does not remove the portion of said two-component epitaxial layer above said crystalline region of said substrate, and wherein the etching of said two-component epitaxial layer comprises first flowing the etch gases $Cl_2$ and $H_2$ in the ratio 16 sccm:1 slm for about 45 seconds and then doing a hydrogen gas purge at 2 slm for about 2 minutes;

repeating the depositing and etching steps in said process chamber until a two-component epitaxial film of a desired thickness is formed above said crystalline region of said substrate;

implanting charge-carrier dopant impurity atoms into said two-component epitaxial film to form a three-component amorphous film; and crystallizing said three-component amorphous film with a kinetically-driven crystallization process to form a three-component epitaxial film.

4. The method of claim 3 wherein said process chamber is held at a temperature in the range of 525-625 degrees C. during the depositing and etching steps.

5. A method of forming a semiconductor structure comprising:

forming a gate dielectric layer above a channel region in a crystalline substrate;

forming a gate electrode above said gate dielectric layer;

forming amorphous dielectric gate isolating spacers adjacent to the sidewalls of said gate electrode;

forming an amorphous gate electrode protecting layer above said gate electrode forming a source/drain region in said crystalline substrate;

removing a portion of said crystalline substrate, including said source/drain region, to form an etched-out region in said crystalline substrate;

depositing non-selectively in a process chamber a two-component epitaxial layer above said etched-out region in said crystalline substrate, above said amorphous dielectric gate isolating spacers, and above said amorphous gate electrode protecting layer, wherein said two-component epitaxial layer is comprised of carbon-doped silicon, and wherein the depositing of said two-component epitaxial layer comprises first flowing the deposition gases $SiH_4$, $CH_3SiH_3$ and $H_2$ in a ratio of 300:55:500 sccm for about 1 minute and then doing a hydrogen gas purge at 1 slm for about 1 and then without removing said substrate from said chamber, etching in said process chamber said two-component epitaxial layer, wherein etching said two-component epitaxial layer removes the portion of said two-component epitaxial layer above said amorphous dielectric gate isolating spacers and above said amorphous gate electrode protecting layer, wherein etching said two-component epitaxial layer does not remove the portion of said two-component epitaxial layer above said etched-out region in said crystalline substrate, and wherein the etching of said two-component epitaxial layer comprises first flowing the etch gases $Cl_2$ and $H_2$ in the ratio 16 sccm:1 slm for about 45 seconds and then doing a hydrogen gas purge at 2 slm for about 2 minutes;

repeating the depositing and etching steps in said process chamber until a two-component epitaxial film of a desired thickness is formed above said etched-out region in said crystalline substrate;

implanting charge-carrier dopant impurity atoms into said two-component epitaxial film to form a three-component amorphous film; and crystallizing said three-component amorphous film with a kinetically-driven crystallization process to form a three-component epitaxial film.

6. The method of claim 5 wherein said process chamber is held at a temperature in the range of 525-625 degrees C. during the depositing and etching steps.

* * * * *

UNITED STATES PATENT AND TRADEMARK OFFICE
CERTIFICATE OF CORRECTION

| | | |
|---|---|---|
| PATENT NO. | : 7,678,631 B2 | Page 1 of 1 |
| APPLICATION NO. | : 11/448247 | |
| DATED | : March 16, 2010 | |
| INVENTOR(S) | : Murthy et al. | |

It is certified that error appears in the above-identified patent and that said Letters Patent is hereby corrected as shown below:

In column 12, at line 19 after, -- about 1 -- insert -- minute --.

Signed and Sealed this
Fifteenth Day of March, 2011

David J. Kappos
*Director of the United States Patent and Trademark Office*